United States Patent [19]

Dermon et al.

[11] Patent Number: 4,980,638
[45] Date of Patent: Dec. 25, 1990

[54] MICROCIRCUIT PROBE AND METHOD FOR MANUFACTURING SAME

[76] Inventors: John A. Dermon, 1340 Greenwood Ave., Palo Alto, Calif. 94301; Dale T. Trenary, 13320 Southeast-McGillivary, Vancouver, Wash. 98684

[21] Appl. No.: 358,303
[22] Filed: May 26, 1989
[51] Int. Cl.⁵ .............................................. G01R 1/06
[52] U.S. Cl. ................................ 324/158 P; 324/72.5
[58] Field of Search ............... 324/158 P, 158 F, 72.5; 369/173

[56] References Cited

U.S. PATENT DOCUMENTS

| | | | |
|---|---|---|---|
| 1,114,493 | 10/1914 | Levin | 369/173 |
| 1,207,350 | 12/1916 | Wahlquist et al. | 369/173 |
| 1,211,559 | 1/1917 | Dunlany | 369/173 |
| 1,312,849 | 8/1919 | Hunt | 369/173 |
| 3,613,001 | 10/1971 | Hostetter | 324/158 P |
| 3,648,169 | 3/1972 | Wiesler | 324/158 P |
| 3,702,439 | 11/1972 | McGahey et al. | 324/158 P |
| 3,803,709 | 4/1974 | Beltz et al. | 324/158 P |
| 3,812,311 | 5/1974 | Kvaternik | 324/158 P |
| 3,867,698 | 2/1975 | Beltz et al. | 324/158 P |
| 3,930,809 | 1/1976 | Evans | 324/158 F |

FOREIGN PATENT DOCUMENTS 12456 of 1902 United Kingdom ................ 369/173

OTHER PUBLICATIONS

VPC Catalog No. 104; Virginia Panel Corporation; Waynesboro, VA; 4 pages; 1983; Copp in 324-158 P.

*Primary Examiner*—Ernest F. Karlsen
*Attorney, Agent, or Firm*—Lyon & Lyon

[57] ABSTRACT

An electrically conductive probe of controlled shape and dimension useful in testing the functionality and performance of microcircuits and a method for manufacturing it are disclosed. The probe may be generally square or rectangular in cross section and consists of three distinct sections; the terminal end which is capable of being electrically contacted, the shaft which connects the terminal end to the probe tip, and the probe tip which is to make electrical contact with a microcircuit.

7 Claims, 2 Drawing Sheets

MICROCIRCUIT PROBE AND METHOD FOR MANUFACTURING SAME

BACKGROUND OF INVENTION

1. Field of the Invention

The present invention relates to microcircuit probes. More particularly, the present invention relates to an improved microcircuit probe and a method for its manufacture.

2. The Prior Art

After the manufacture of microcircuits it is typical that they be electrically tested prior to delivery as a finished product. As microcircuits have become more complex the associated electrical testing has also become more complex and expensive. It is desirable that the microcircuit be tested for electrical functionality even prior to the permanent application of terminal leads to the product. Prior to this permanent application of terminal leads, the electrically conductive probe is the means by which elements of macroscopic test equipment contact microscopic circuit elements. Because of the microscopic size of the area of electrical contact on a microcircuit it is critical to maintain tight dimensional control over any element which makes physical contact with such an area.

Present microcircuit probes are generally circular in cross section and are generally made by nickel plating a one inch long piece of 0.010" diameter wire, usually made of tungsten. One end of the wire about 0.200" long is electrochemically etched into a point and a bend about 0.020" long is made at a precise angle with the rest of the wire. The tip is then sanded to reach a final tip length of about 0.007" and cross section of about 0.002".

The probe tips of the prior art present several problems. First, the process of manufacturing the probe is time consuming, occasionally inaccurate, resulting in scrap.

In addition, in order for the probe tip to achieve the correct force on the microcircuit pad, it is necessary for the diameter of the probe to be at least 0.010". This presents a limitation as to how closely together probes can be placed before electrical interference occurs, or probes physically touch. Current microcircuit pad spacings are about 0.008" center to center.

As probes are used, wear occurs and the probe tip becomes shorter and the diameter of the contact area of the tip increases, due to the taper. As the tip diameter increases, the pressure that the tip exerts on the microcircuit pad decreases, eventually resulting in poor electrical contact.

Furthermore, probes must occasionally be replaced after they have been in use. This is difficult with current technology because the non-tapered end of the replacement probe does not always easily fit back into the hole from which the original probe was removed. This problem is further complicated by the fact that probes having circular cross sections are not easily handled with tweezers.

Accordingly, it is one object of the present invention to provide a higher quality and more cost effective probe having special utility to effect temporary electrical connection between a microcircuit and electrical test equipment. It is another object of the invention to provide a novel method of manufacturing this electrically conductive probe in such a manner as to guarantee its higher quality and cost effectiveness.

BRIEF DESCRIPTION OF THE INVENTION

The invention comprises an electrically conductive probe consisting of a terminal end, a shaft, and a tip. The terminal end provides the means for electrical connection to test equipment. The shaft provides the means for physical support and is also the electrical connection between the terminal end and the probe tip. The probe tip provides the means for temporary contact to areas of microcircuits. In another aspect of the invention, the probe of the present invention may be manufactured by masking and then etching a sheet of electrically-conductive material, such as tungsten, beryllium-copper, palladium, or the like. The finished probes may then be removed from a "frame" left as a result of the etch mask. The terminal ends of the individual probes may then be plated or solder coated if desired.

The probes of the present invention may be used to probe the pads of microcircuit die as is known in the art, and may also be used to contact other areas, such as leads or other nodes of completed circuits, biological specimens, etc., and the scope of the present invention should be construed accordingly.

DETAILED DESCRIPTION OF A PREFERRED EMBODIMENT

Figure 1:
FIG. 1 is an enlarged side view of a single probe according to the present invention.

Referring first to FIG. 1, a presently-preferred embodiment of a probe 10 according to the present invention is shown. The probe has a terminal end portion 12, a shaft portion 14, and a tip portion 16. Probe 10 is generally square or rectangular in cross section, and may be made from an electrically-conductive material, such as tungsten, beryllium-copper, palladium, or the like.

In a presently preferred embodiment, probe 10 is approximately 0.007" by 0.009" in cross section. The tip portion of probe 10 has a presently preferred length of 0.007" and the length of the shaft and terminal end portion form the angle is about 1". As will be more clearly shown with respect to FIG. 4, the tip portion tapers from about 0.003" square to about 0.002" square at the tip.

In a presently preferred embodiment, the side of the body of the probe opposite to the direction of the bend in the tip is linearly tapered from the middle of the shaft portion 14 to the terminal end portion 12 from a dimension of about 0.009" to about 0.005". This taper facilitates replacement of a probe by making it easier to place the replacement probe into the hole resulting from the removal of the original probe.

Figure 2:
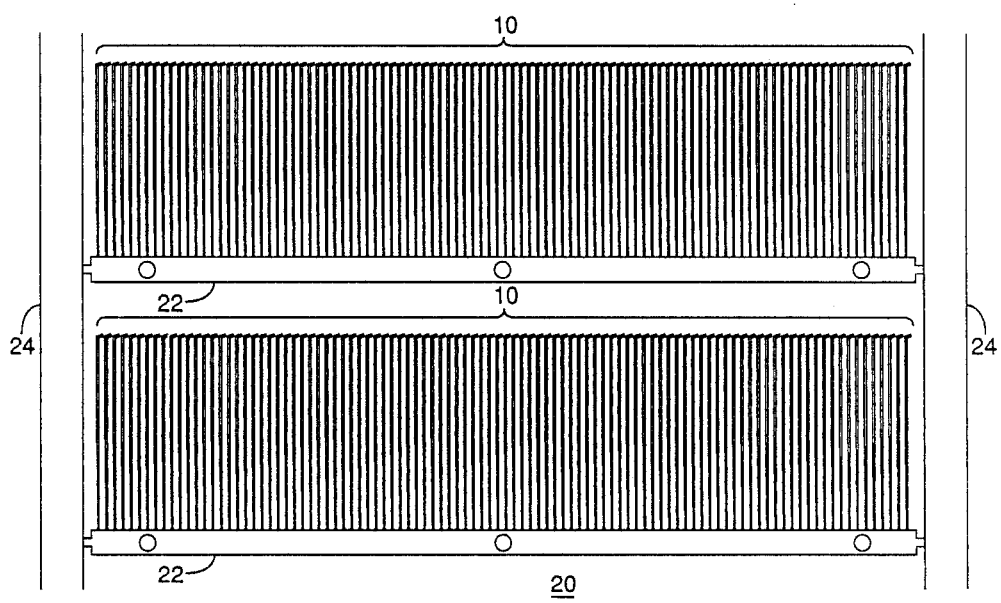
FIG. 2 is an enlarged fragmentary view of an array of strips of probes after initial manufacturing processing according to a presently preferred embodiment of the invention.

According to a presently-preferred embodiment, the probes 10 of the present invention are formed by etching thin sheets of electrically conductive material into an array 20 containing a plurality of frames 22. Each frame 22 contains a plurality of shaped probes 10 connected thereto. The frames 22 may be connected together at their edges to support members 24 as shown in FIG. 2. According to a presently preferred embodiment, the ends of frames 22 are reduced width portions to facilitate removal of frames 22 from frame support members 24.

Figure 3:
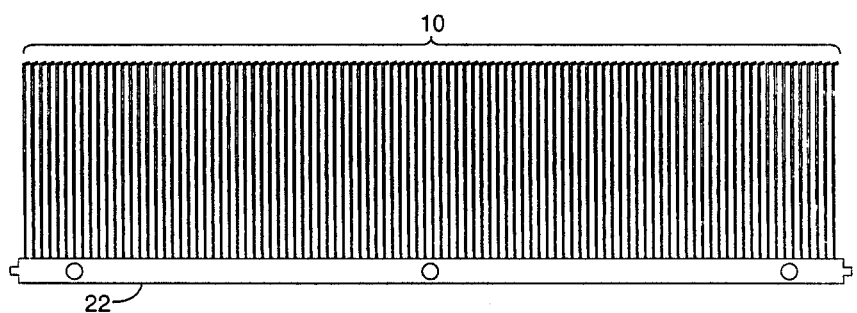
FIG. 3 is an enlarged view of a strip of probes after separation from an array of strips.

Referring now to FIG. 3, a single strip 22 of probes 10 is shown after the step of separation from array 20 has been performed. The array 20 of probes 10 may be separated into strips 22, by cutting or bending or by any other similar convenient means to remove the frame edges.

According to a presently preferred embodiment, the sheets of conductive material from which the probes of the present invention are made are fabricated from tungsten, beryllium-copper, palladium, or other like electrically conductive materials.

Actual dimensions and material selection depend to a great extent on the dimensions and the material to be probed or contacted. Determination of these parameters and materials is a design choice well within the skill of the ordinary worker in the art. For example, for probing integrated circuit die, tungsten probes can be used having a tip cross section of about 0.002" square, a tip bend angle of about 102° and a tip length of about 0.007".

First, both sides of a sheet of starting material are coated with a layer of photoresist as is known in the art. The probe pattern is then transferred to the photomask using known techniques. Alternatively, a resist may be applied by the use of a screen as is known in the art. The masked sheet is then etched in an etchant to remove the unwanted regions of material.

In one example, a 0.007" thick sheet of tungsten is masked and developed using conventional photolithography steps, and may be etched at room temperature in a solution of nitric acid and hydrofluoric acid until the unwanted regions are removed.

Depending on the selection of probe material, the terminal end portion 12 may have to be plated with a material to facilitate soldering or other means of electrical connection. For example, a tungsten probe may be plated with about 100 microinches of nickel using conventional plating techniques in order to facilitate soldering.

Figure 4A:
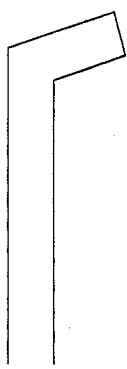
FIG. 4a is an enlarged fragmentary view of a probe tip prior to tip processing.
Figure 4B:
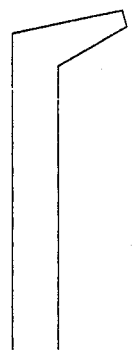
FIG. 4b is an enlarged fragmentary view of a probe tip after tip processing.

The tip portion 16 may be further processed to obtain the final tip dimensions. Referring first to FIG. 4a, the tip portion 16 of a probe 10 is shown prior to tip processing. Referring next to FIG. 4b, tip portion 16 of probe 10 is shown after tip processing. According to a presently preferred embodiment of the present invention, tip processing may include electrochemical etching of the tip portion 16 of probe 10 in a basic solution. It is presently preferred to etch in a solution of about 200 grams/liter of sodium hydroxide in water at a positive voltage of three volts applied to base area assembly portion of strip 22. The publication "Refractory Metals and Custom Fabrication" at p. 25, available from the Rembar Company, Inc., of Dobbs Ferry, New York discusses electrolytic etching of tungsten.

Figure 5:
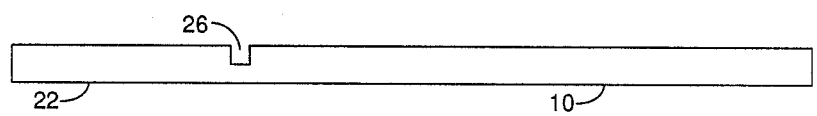
FIG. 5 is an enlarged fragmentary view of a base assembly from a strip of probes showing means for easy separation of individual probes.

The final probe is obtained by separating the probe from the frame 22 by cutting or bending, or by any other similar convenient means. Separation may be facilitated by half etching the terminal end portion 12 of probe 10 where it contacts frame 22. Half etching may be accomplished as is known in the art by configuring the photomask on one of the surfaces of the sheet to etch the desired region as is known in the art by providing apertures to etch the regions shown in FIG. 5. In FIG. 5, an individual probe 10 is shown as a side view connected to frame 22. At the region where probe 10 contacts frame 22, a notch 26 indicates the region where half etching has occurred.

What is claimed is:

1. A microcircuit probe having a terminal end portion, a shaft portion, and a tip portion, said probe fabricated from a conductive material and being generally rectangular in cross section, said tip portion being disposed at a predetermined angle from said shaft portion, said shaft portion including a taper, said taper running from approximately the center of said shaft portion to said terminal end portion on the side of said probe opposite to the direction of the bend in said tip portion.

2. The microcircuit probe of claim 1 wherein said terminal end portion is plated with nickel.

3. The microcircuit probe of claim 1 wherein the untapered portion of said shaft portion is about 0.007" by 0.009" in cross section, and said tip portion is equipped with a taper on both sets of opposing faces of said rectangular cross section.

4. The microcircuit probe of claim 1 wherein said taper on said probe away from the direction of said tip tapers from 0.009" by 0.007" beginning at the approximate center of said shaft portion to 0.005" by 0.007" at the end of said terminal end portion.

5. The microcircuit probe of claim 1 wherein said predetermined angle is about 102°.

6. The microcircuit probe of claim 1 wherein said tip portion has a length of about 0.007" and the length from said predetermined angle to the end of said terminal end portion is about 1".

7. The microcircuit probe of claim 1 fabricated from tungsten.

* * * * *